(12) United States Patent
Caldwell et al.

(10) Patent No.: US 8,912,936 B1
(45) Date of Patent: Dec. 16, 2014

(54) ELECTRIC SIGNAL CONVERSION

(71) Applicant: Analog Devices Technology, Hamilton (BM)

(72) Inventors: Trevor Clifford Caldwell, Toronto (CA); Richard E. Schreier, Toronto (CA); David Alldred, Toronto (CA); Wenhua W. Yang, North Andover, MA (US)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/905,251

(22) Filed: May 30, 2013

(51) Int. Cl.
*H03M 3/00* (2006.01)
(52) U.S. Cl.
CPC ..................... *H03M 3/30* (2013.01)
USPC ........................... 341/143; 341/144
(58) Field of Classification Search
CPC ..... H03M 1/067; H03M 1/165; H03M 1/367; H03M 1/66; H03M 1/1004
USPC .......................... 341/144, 155, 138, 140, 141
See application file for complete search history.

(56) References Cited

U.S. PATENT DOCUMENTS

| | | | | |
|---|---|---|---|---|
| 4,951,054 A * | 8/1990 | Kohdaka | ........................ | 341/138 |
| 6,218,977 B1 * | 4/2001 | Friend et al. | .................. | 341/163 |
| 6,344,812 B1 * | 2/2002 | Takeda et al. | ................. | 341/143 |
| 6,603,418 B2 * | 8/2003 | Al-Awadhi | .................... | 341/144 |
| 6,842,130 B2 * | 1/2005 | Wang et al. | ................... | 341/143 |
| 7,982,650 B2 * | 7/2011 | Lee et al. | ....................... | 341/144 |
| 8,022,850 B2 * | 9/2011 | Newman | ........................ | 341/144 |
| 2009/0121909 A1 * | 5/2009 | Kim et al. | ...................... | 341/144 |
| 2012/0176264 A1 * | 7/2012 | Parida et al. | ................... | 341/144 |
| 2012/0262322 A1 * | 10/2012 | Kelly et al. | .................... | 341/155 |
| 2013/0063294 A1 * | 3/2013 | Lin et al. | ....................... | 341/144 |
| 2013/0278453 A1 * | 10/2013 | Steensgaard-Madsen | .... | 341/110 |

* cited by examiner

*Primary Examiner* — Peguy Jean Pierre
(74) *Attorney, Agent, or Firm* — Patent Captial Group

(57) ABSTRACT

In one aspect, an electrical signal converter is disclosed. The exemplary electrical signal converter may include a plurality of ordered converter elements. Element selection logic may be provided to pseudorandomly select a pointer to a switch matrix, wherein the switch matrix maps converter elements according to a stepwise "delta-two-maximum pattern." Advantageously, pseudorandom stepwise delta-two-maximum patterns may be applied both to a first order converter, and to a feedback converter for error correction.

23 Claims, 5 Drawing Sheets

ELECTRIC SIGNAL CONVERSION

BACKGROUND

This application relates to the field of signal conversion, and more particularly to pseudorandom selection of converter elements in an electrical signal converter. Conversion generally involves converting one species of signal to another species. For example, a digital-to-analog (DAC) converter receives a binary-encoded digital signal and outputs a corresponding analog signal. Similarly, an analog-to-digital converter (ADC) receives an analog input signal and outputs a corresponding binary-encoded digital signal. Certain electrical signal converters have a plurality of converter elements, for example with each converter element operating on one bit of input and providing one bit of output.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY OF EXAMPLE EMBODIMENTS

Figure 1:
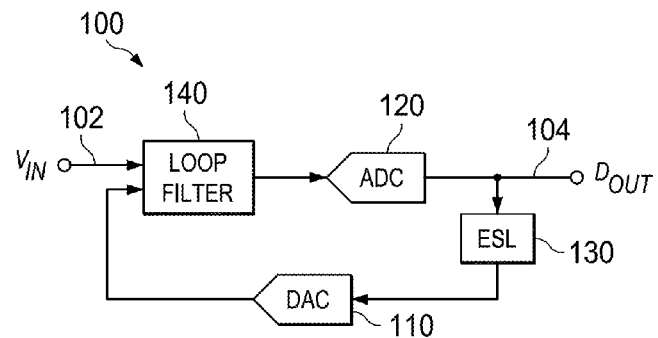
FIG. 1 is a block diagram of an exemplary delta-sigma modulator.

In one embodiment, there is disclosed an electrical signal converter comprising: a plurality of inputs for receiving a first species of signal; a plurality of converter elements for converting the first species of signal into a second species of signal; a switch for mapping the plurality of inputs to the plurality of converter elements; and logic configured to cause the switch to map the inputs on a plurality of successive input cycles to different converter elements according to a delta-two-maximum pattern.

In another embodiment, there is disclosed a delta-sigma modulator comprising an analog-to-digital converter configured to receive an analog input and provide a digital output, the analog-to-digital converter comprising a plurality of ordered converter elements and logic to rotate converter elements according to a first stepwise delta-two-maximum pattern; a digital-to-analog converter configured to receive the digital output of the analog-to-digital converter and provide an analog output, the digital-to-analog converter comprising a plurality of ordered converter elements and logic rotate converter elements according to a second stepwise delta-two-maximum pattern; a loop filter configured to receive the analog input and the analog output of the digital-to-analog converter, and to provide a filtered analog signal the analog-to-digital converter; and element selection logic configured to select a number of steps.

In yet another embodiment there is disclosed a method performed by an electrical signal converter comprising during a first time period, selecting a first converter element from among a plurality of available ordered converter elements in the electrical signal converter; during a second time period: calculating a pseudorandom number; selecting a second converter element by stepping through available converter elements according to a delta-two-maximum pattern, the number of steps being a function of the pseudorandom number.

DETAILED DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiment many have different advantages, and no particular advantage is necessarily required of any embodiment.

FIG. 1 provides a block diagram of delta-sigma modulator (DSM) 100. DSM 100 receives an analog input signal 102, which ADC 120 is to convert to a digital output signal 104. In some embodiments, ADC 120 may be a flash ADC. Flash ADCs are known in the art, and are generally considered to trade relatively high speed for relatively low precision. To compensate for imprecision, a digital-to-analog converter (DAC) 110 is provided in a feedback loop, feeding back its analog output to loop filter 140. Loop filter 140 filters out undesirable input frequencies and combines the filtered feedback from DAC 110 with input signal 102. The combined signal is provided to ADC 120 to refine conversion of digital output 104.

Element selection logic 130 is provided to address the issue of non-linearity in conversion results. Specifically, both ADC 120 and DAC 110 may include a plurality of ordered converter elements, each of which may suffer from unpredictable non-linearity. Because non-linearity is generally characterized within a plus-or-minus tolerance, non-linearity from one converter element may in fact compensate for non-linearity in another converter element. Further, consistent use of the same converter elements on the same bits of information may lead to persistent or compound errors. Thus, it is desirable to introduce a pseudo-random element selection method so that consecutive conversion cycles are processed through different converter elements.

For example, in an 8-level ADC, with converter elements ordered 1-8, where four bits of data are to be processed (including one or more cycles of feedback for error correction), it is not desirable to always process the four bits on converter elements 1-4. Rather, it is desirable to process the four bits on a pseudorandom selection of four converter elements on each cycle. Thus, according to one embodiment of the present disclosure, ESL 130 is configured to use a pseudorandom selection to process individual bits on converter elements according to a non-linear pattern, where non-linear in this context means that elements are not necessarily processed on contiguous blocks and/or when stepping through ordered elements. For n conversion bits on subsequent processing cycles, a pointer p is incremented according to some method other than, for example, p+1 or p+n, or more generally p+C, for some given constant C. More specifically, in some embodiments disclosed herein, the non-linear pattern is a "delta-two-maximum" pattern, meaning that for any pointer step, a converter element's new designation is no more than two positions from its previous designation (e.g., 1 moves to 2 or 3; 2 moves to 1, 3 or 4; 3 moves to 1, 2, 4 or 5, and so on).

Figure 2:
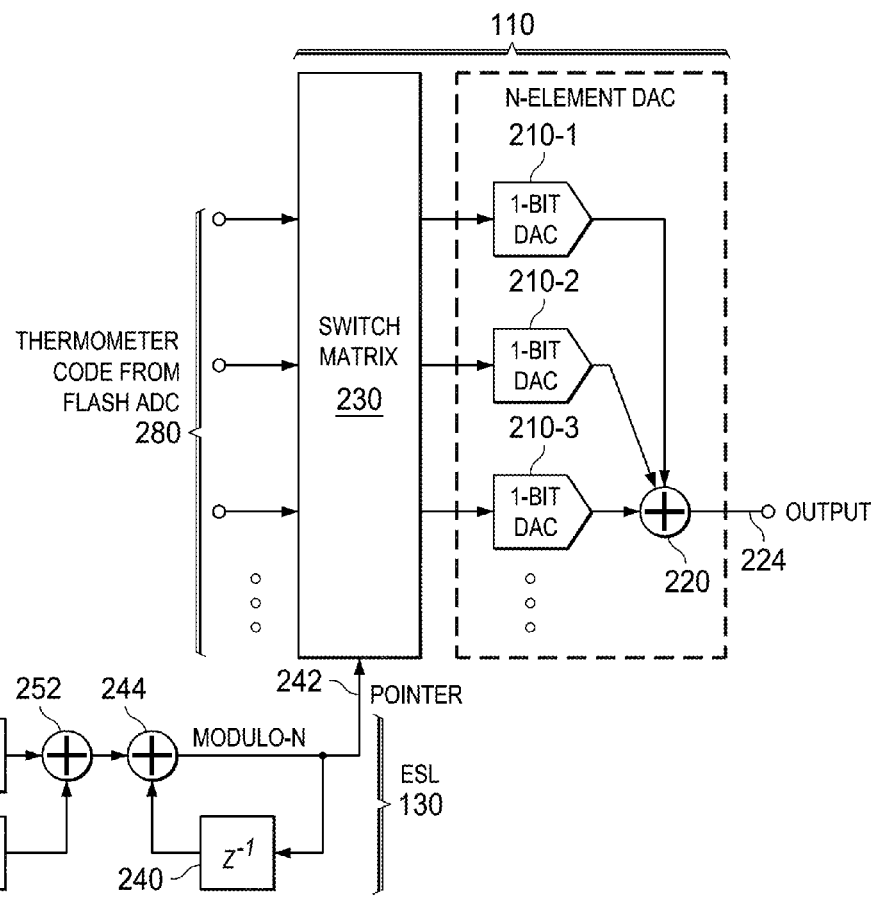
FIG. 2 is a block diagram of an exemplary digital-to-analog converter.

FIG. 2 is a block diagram of an exemplary implementation of DAC 110. In this exemplary embodiment, DAC 110 has n converter elements 210, each 1-bit wide. A summation block 220 is provided to sum each the analog outputs. Summation can be performed without respect to position because the input signal 280 is a thermometer code, meaning that all significant information is carried by the number of bits activated, without respect to the position of each bit.

More particularly, a thermometer code is concerned only with the number of bits set to "1," not with the position of those bits. For example, an 8-bit thermometer code has only eight possible states: 00000000, 00000001, 00000011, 00000111, 00001111, 00011111, 00111111, 01111111, and 11111111. Other combinations of codes are valid, but are equivalent to one of the foregoing. For example, 11001111 and 10101111 are both exactly equivalent to 00111111. Thus, for example, an 8-level analog-to-digital converter with a range of 0-8V, if receiving a 6V input signal, will output a thermometer code of 00111111 or its equivalent. An 8-level digital-to-analog converter receiving the thermometer code 00111111 or its equivalent will output 6V. Thus, analog output 224 contains all information encoded by input signal 280, regardless of position of each bit. Non-linearities may be introduced by any converter element 210. For example, if each converter element 210 is configured to output 1V, in practice each converter element 210 may put out an output signal between 0.95V and 1.05V, assuming an exemplary 5% tolerance. Thus, the output voltage may be slightly higher or slightly lower than the nominal output voltage. Therefore, for example, if bits 1-3 provide outputs on the high end, then the first four output bits will always provide a signal that is too high.

Switch matrix 230 may be provided to map input bits to converter elements 210. Mapping may be controlled by a pointer 242, which is provided by ESL 130. In one embodiment, switch matrix 230 includes internal logic implementing a stepwise delta-two-maximum pattern for cycling converter elements, while pointer 242 provides a number of steps to use. Switch matrix 230 may also include state memory, so that pointer 242 may provide an offset from the present location rather than an absolute starting point. It should be recognized that although these functions are described as being encoded within switch matrix 230, they could also be implemented in ESL 130, in which case switch matrix 230 may be a "dumb" matrix.

ESL 130 is configured to provide pointer 242 as a pseudo-random number. The element selection logic can be provided by either dedicated hardware or on software running on a digital signal processor (DSP) or other processor. In some embodiments, a fixed integer 260 may be provided as a starting offset. Pseudorandom number generator 250 provides a randomized integer output, which is summed in adder 252 with fixed integer 260. The result is then sent to step counter 244, which steps incrementally from 1 to n (the number of elements), then recycles back to 1, thus maintaining a pointer "memory."

Figure 3:
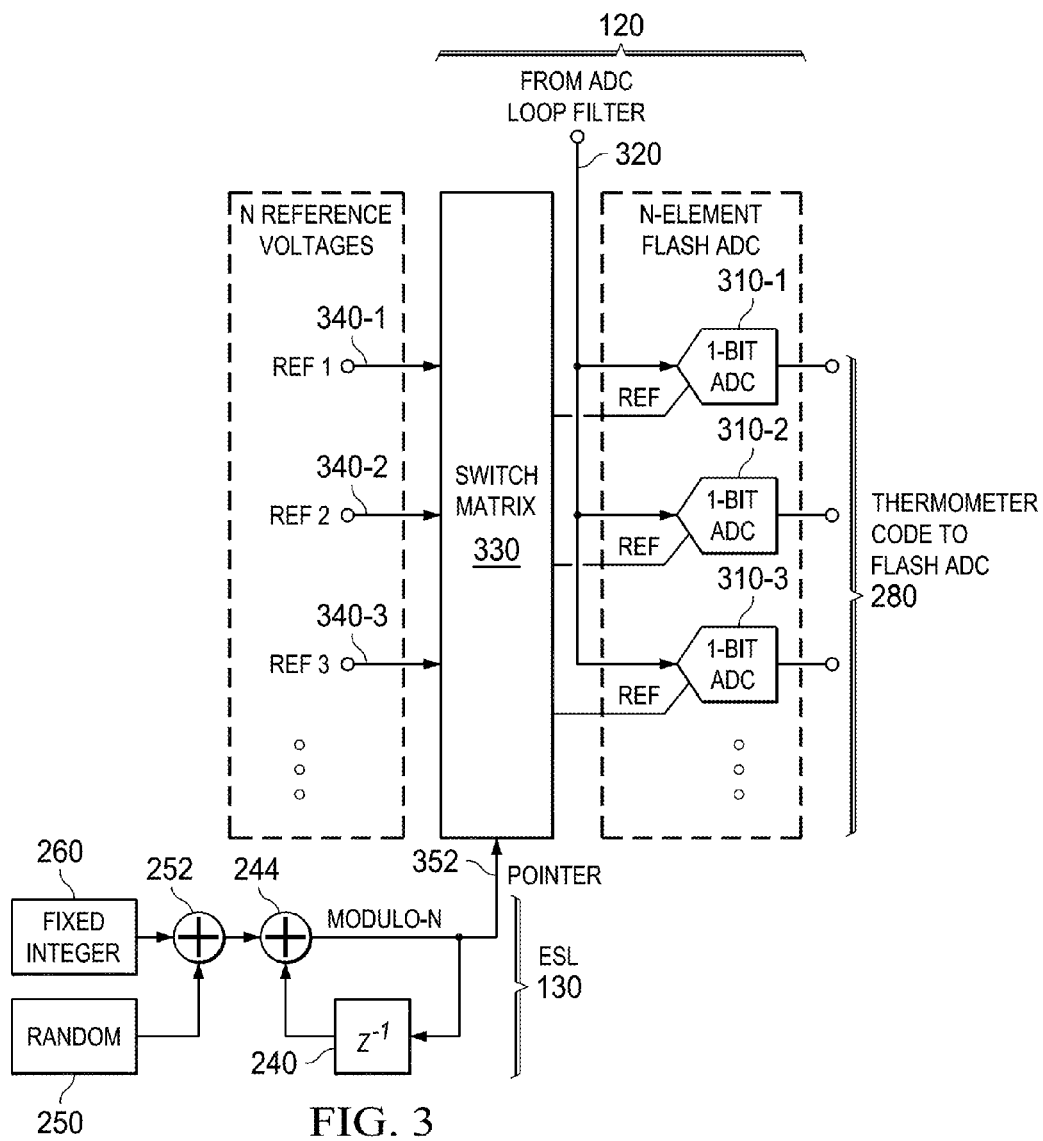
FIG. 3 is a block diagram of an exemplary analog-to-digital converter.

FIG. 3 is a block diagram of ADC 120, which also may suffer from non-linear outputs and therefore may use ESL 130 to step through converter elements. In this case, ESL 130 may be essentially identical to ESL 130 as applied to DAC 110, and in fact in some embodiments may be the same hardware or software element. Switch matrix 330 maps reference voltage inputs 340 to ADC converter elements 310, and similar to switch matrix 230 may include logic for non-linearly stepping through ordered converter elements. As with DAC 110, logic may also be offloaded to ESL 130.

In the case of ADC 120, a plurality of reference voltages 340 are provided at different levels. Each ADC converter element 310 may include a comparator to compare the input signal with a reference level 340. For example, an 8-bit ADC with a range of 8V may have reference voltages 340 corresponding to 1V, 2V, 3V, 4V, 5V, 6V, 7V, and 8V. A 6V input signal will be compared to each of these references, and a "1" will be output for each reference that is less than the input voltage. Output 280 is a thermometer code with a number of bits set to "1" corresponding to the highest level matched. In this example, non-linearities will occur primarily with reference to the 6V comparison. Some comparators will output a "1" and others may output a "0," so that in some cases, the result will read "5V" and in other cases, the result will read "6V." Once again, all relevant information may be encoded in the number of significant bits, with order being irrelevant.

If erroneous values from DAC 110 are used for feedback, the error can be compounded. For example, if a nominal 6V signal is encoded as a 5.98V output signal, and the result is used as feedback in an exemplary 8-level ADC 120, the feedback signal will be encoded as 5V. Loop filter 140 (FIG. 1) may then use this erroneous value in a negative feedback loop to refine the output 104 of ADC 120 within a frequency band of interest.

Figure 4:
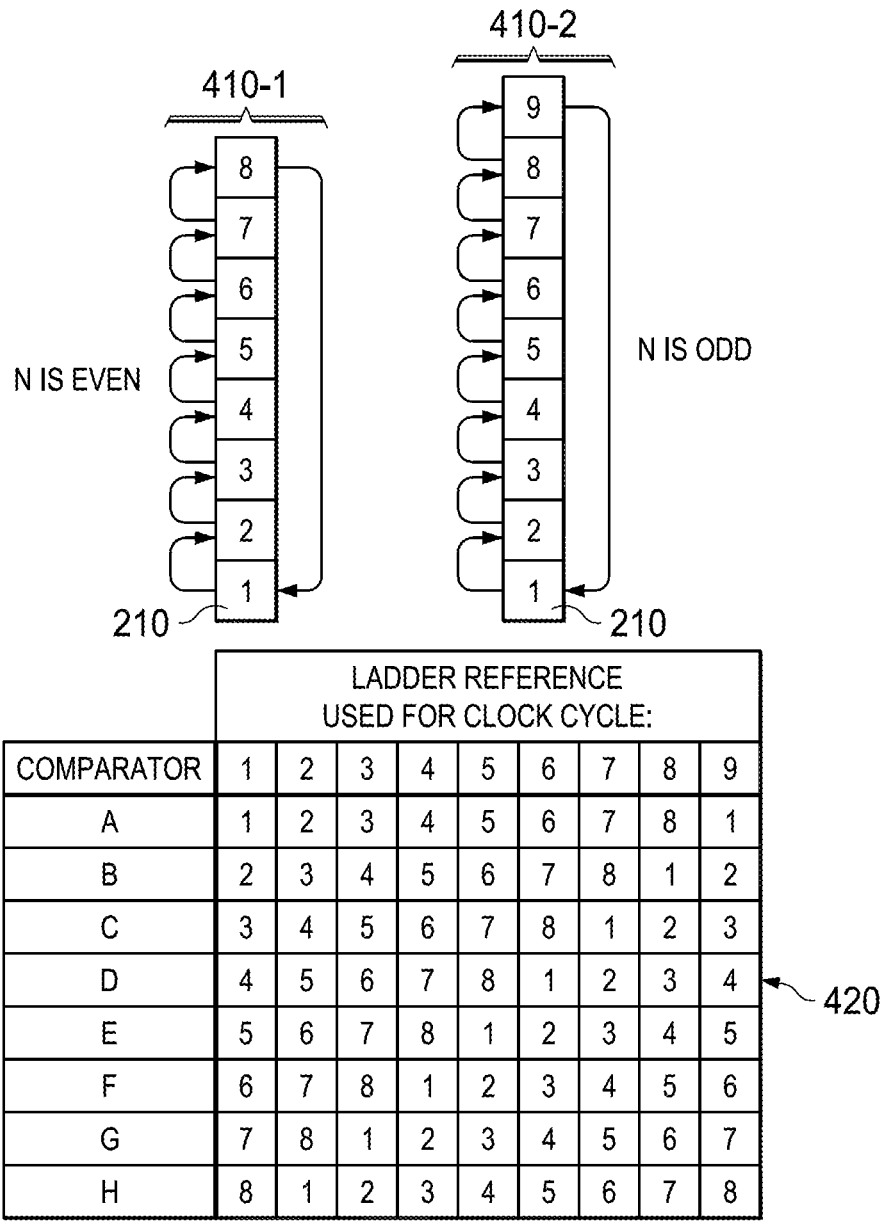
FIG. 4 is a flowchart of an exemplary linear pattern for cycling through converter elements.

FIG. 4 is a flowchart of an exemplary linear pattern 410 for stepping through ordered converter elements. In the following examples, DAC converter elements 210 (FIG. 2) will be used for illustrative purposes only. Those having skill in the art, however, will recognize that the methods disclosed here may be applied to any electrical signal converter having a plurality of ordered and essentially identical elements. In some cases, the order of bits may matter, in which case, additional logic processing may need to be applied to outputs to reorder bits.

In this example, each converter element 210 is linearly incremented in order. For example, if in the previous state, converter elements 210 were used in the order 1, 2, 3, 4, 5, 6, 7, 8, and if ESL 130 provides "3" for pointer 242, then on the next cycle, each converter element 210 will be incremented by three positions, so that elements will be processed in the order "4, 5, 6, 7, 8, 1, 2, 3." In some cases, the large physical distance between the highest-numbered element and element 1 will cause unacceptably large settling times or other delays. Thus, for some applications, the embodiment of FIG. 4 in which converter elements 210 are incremented linearly may be unsuitable. Table 420 discloses eight converter elements 210, designated "A" through "H," and indicates which will receive which bit of input after a given number of increments. In this exemplary embodiment, converter elements 410 are stepped through in a straightforward, linear pattern.

Figure 5:
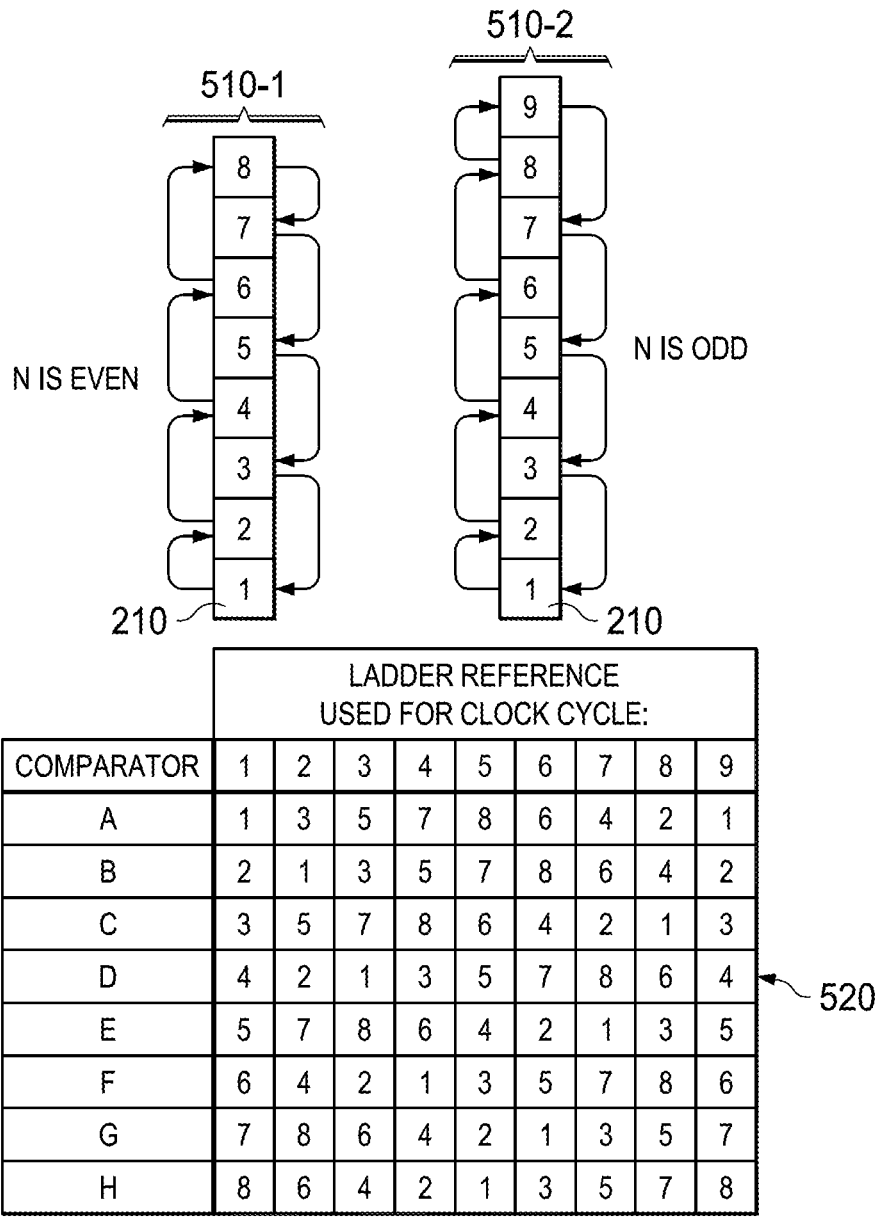
FIG. 5 is a flowchart of an exemplary delta-two-maximum pattern for cycling through converter elements.

FIG. 5 is a flowchart of an exemplary embodiment of a delta-two-maximum pattern for converter elements 210. This embodiment may be referred to as a "leap frog" pattern 510, because most converter elements 210 "leap frog" over an adjacent converter element to get to their new positions. Two options are disclosed for n representing the number of converter elements 210.

If n is even, then 1 steps to 2, n steps to n−1, all other even elements step to n+2, and all other odd elements step to n−2. If n is odd, the same pattern is followed, except that n−1 steps to n. Advantageously, in this embodiment, no converter element 210 ever steps more than two places from its previous position in one cycle.

Stated generally, for a converter element presently designated k, and for n converter elements, the next state $k_{t+1}$ for the converter element is given by:

If k==1, $k_{t+1}$=2;
If k is even and k≠n, $k_{t+1}$=k+2;
If k is even and k==n, $k_{t+1}$=k−1;
If k is odd and k #1, $k_{t+1}$=k−2.

Table 520 discloses the position of each converter element 210, labeled "A" through "H," after each step.

Figure 6:
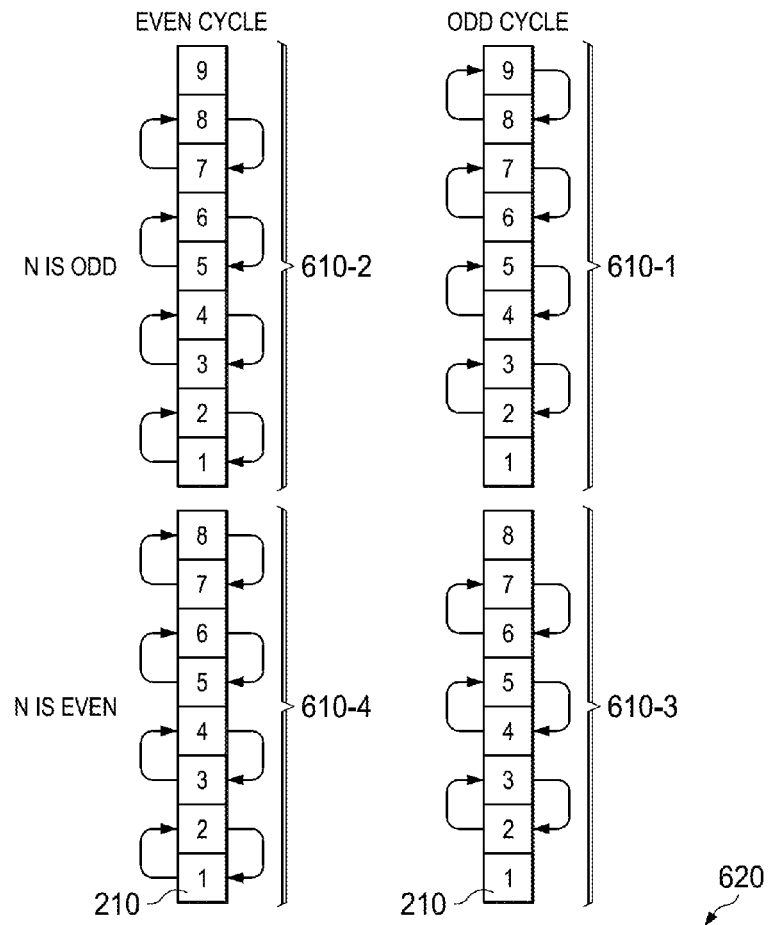
FIG. 6 is a flowchart of another exemplary delta-two-maximum pattern for cycling through converter elements.

FIG. 6 is a flowchart of yet another embodiment of a delta-two-maximum pattern for converter elements 210. This embodiment provides a special case of a delta-two-maximum pattern that has a delta-one maximum. This embodiment may be referred to as a "swapping" pattern 610 because most converter elements 210 are swapped with an adjacent converter element. This is a two-cycle configuration divided into an "odd" and "even" cycle, though it should be recognized that the designations "odd" and "even" are arbitrary with respect to a functioning clock cycle and are selected to refer merely to alternating clock cycles. In some embodiments, additional activity may take place between the two actual clock cycles, so that the terms "odd" and "even" are intended broadly to refer to any set of cycles on which a first cycle performs a first step and a later cycle performs a complementary step.

In swapping pattern 610, on an even clock cycle, each odd element is swapped with the element above it, except for n if n is odd. On an odd clock cycle, each even element is swapped with the element above it, except for n if n is even. This creates four distinct variations of pattern 610. Pattern 610-1 applies to odd n on odd clock cycles, pattern 610-2 applies to odd n on even clock cycles, pattern 610-3 applies to even n on odd clock cycles, and pattern 610-4 applies to even n on even clock cycles.

Pattern 610 can be stated generally as follows:
On even clock cycles:
If k is odd and k # n, $k_{t+1}$=k+1; $(k+1)_{t+1}$=k;
On odd clock cycles:
If k is even and k # n, $k_{t+1}$=k+1; $(k+1)_{t+1}$=k;

Table 620 discloses the position of each converter element 210, labeled "A" through "H," after each step.

In this specification, two delta-two-maximum patterns for pseudorandom selection of converter elements have been disclosed, and it has been further disclosed that both ADC 120 and DAC 110 may use ESL 130 to pseudorandomly select a number of steps to increment matrix switches 230, 330. Advantageously, if ESL 130 is used to pseudorandomly select a number of steps, and if each matrix switch provides a non-linear pattern such as patterns 510, 610, error may be significantly reduced in both stages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential converter elements, modules, and machines described herein should be construed as being encompassed within the broad term 'microprocessor' or 'processor.'

Computer program logic implementing all or part of the functionality described herein is embodied in various forms, including, but in no way limited to, a source code form, a computer executable form, and various intermediate forms (for example, forms generated by an assembler, compiler, linker, or locator). In an example, source code includes a series of computer program instructions implemented in various programming languages, such as an object code, an assembly language, or a high-level language such as OpenCL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the capacitors, buffers, graphics elements, interconnect boards, clocks, DDRs, camera sensors, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. An electrical signal converter, comprising:
a plurality of inputs for receiving a first species of signal;
a plurality of n, converter elements for converting the first species of signal into a second species of signal, wherein n>3;
a switch for mapping the plurality of inputs to the plurality of converter elements; and
logic configured to cause the switch to map the inputs on a plurality of successive input cycles to different converter elements according to a delta-two-maximum pattern, wherein on a first input cycle, a converter element is used at position k, and on a second conversion cycle the converter element is used at position $k_{t+1}$, wherein $|k-k_{t+1}| \leq 2$.

2. The electrical signal converter of claim 1, wherein the converter elements are digital-to-analog converter elements.

3. The electrical signal converter of claim 2, wherein the plurality of inputs form a thermometer code.

4. The electrical signal converter of claim 1, wherein the converter elements are analog-to-digital converters.

5. The electrical signal converter of claim 4, wherein the second species of signal comprises a thermometer code.

6. The electrical signal converter of claim 1, wherein the logic is configured to select the delta-two-maximum pattern according to a pseudorandom input.

7. The electrical signal converter of claim 1, wherein the logic is configured to select the delta-two-maximum pattern according to a pseudorandom input plus a constant.

8. The electrical signal converter of claim 1, wherein the pattern encompasses n ordered converter elements and wherein the delta-two-maximum pattern comprises:
if k is even, $k_{t+1}=k+2$; and if k is odd, $k_{t+1}=k-2$.

9. The electrical signal converter of claim 8, wherein the delta-two-maximum pattern further comprises:
if k==1, $k_{t+1}=2$; and if k is even and k==n, $k_{t+1}=k-1$.

10. The electrical signal converter of claim 1, wherein the pattern encompasses n ordered converter elements and wherein the delta-two-maximum pattern comprises swapping k and k+1.

11. The electrical signal converter of claim 10, wherein the delta-two-maximum pattern further comprises:
on even cycles, if k is odd and k≠n, swap k and k+1;
on odd cycles, if k is even and k≠n, swap k and k+1.

12. A delta-sigma modulator comprising:
an analog-to-digital converter configured to receive an analog input and provide a digital output, the analog-to-digital converter comprising a plurality of n ordered converter elements, wherein n>3, and logic to rotate converter elements according to a first stepwise delta-two-maximum pattern;
a digital-to-analog converter configured to receive the digital output of the analog-to-digital converter and provide an analog output, the digital-to-analog converter comprising a plurality of ordered converter elements and logic rotate converter elements according to a second stepwise delta-two-maximum pattern;
a loop filter configured to receive the analog input and the analog output of the digital-to-analog converter, and to provide a filtered analog signal the analog-to-digital converter; and
element selection logic configured to select a number of steps;
wherein the first stepwise delta-two-maximum pattern and second stepwise delta-two-maximum pattern each ensure that a converter element used at a position k on a first conversion cycle is used at $k_{t+1}$ on a second conversion cycle, wherein $|k-k_{t+1}| \leq 2$.

13. The delta-sigma modulator of claim 12, wherein:
at least one of the delta-two-maximum patterns comprises, for element k, if k is of a first species, $k_{t+1}=k+2$; if k is of a second species, $k_{t+1}=k-2$.

14. The delta-sigma modulator of claim 12, wherein:
the digital-to-analog converter comprises n converter elements;
the delta-two-maximum pattern comprises two cycles, wherein, for element k:
on the first cycle, if k is odd, swap k and k+1;
on the second cycle, if k is even, swap k and k+1.

15. The delta-sigma modulator of claim 12, wherein the element selection logic selects the number of steps by calculating a pseudorandom number plus a constant.

16. A method performed by an electrical signal converter, comprising:
during a first time period, selecting a first converter element from among a plurality of n available ordered converter elements in the electrical signal converter, wherein n>3;
during a second time period:
calculating a pseudorandom number;
selecting a second converter element by stepping through available converter elements according to a delta-two-maximum pattern, the number of steps being a function of the pseudorandom number and being less than two.

17. The method of claim 16, wherein the function of the pseudorandom number includes addition of a constant.

18. The method of claim 17, wherein the constant is one.

19. The method of claim 16, wherein the delta-two-maximum pattern includes the steps 1-2-4-6-8 and 7-5-3-1.

20. The method of claim 16, wherein the delta-two-maximum pattern comprises shifting converter elements up or down two elements 21. The method of claim 16, wherein the delta-two-maximum pattern comprises swapping adjacent converter elements.

22. The method of claim 16, wherein the delta-two-maximum pattern comprises:
for element k, if k is of a first species, $k_{t+1}=k+2$; if k is of a second species, select $k_{t+1}=k-2$.

23. The method of claim 16, wherein:
the delta-two-maximum pattern comprises two cycles, wherein, for element k:
on the first cycle, for a first species of k, swap k and k+1;
on the second cycle, for a second species of k, swap k and k+1.

* * * * *